United States Patent [19]
Chern

[11] Patent Number: 5,514,985
[45] Date of Patent: May 7, 1996

[54] VIRTUAL AMPLIFIER

[75] Inventor: Shy-Shiun Chern, Anaheim, Calif.

[73] Assignee: Rockwell International Corporation, Seal Beach, Calif.

[21] Appl. No.: 622,467

[22] Filed: Dec. 5, 1990

[51] Int. Cl.⁶ .............................. G06G 7/12; H03K 5/159
[52] U.S. Cl. .................................. 327/3; 331/17
[58] Field of Search ..................... 307/490, 353; 328/155

[56] References Cited

U.S. PATENT DOCUMENTS 4,668,918  5/1987  Adams ..................................... 328/155
4,745,303  5/1988  Hubbs ..................................... 307/353

*Primary Examiner*—David C. Cain
*Attorney, Agent, or Firm*—John C. McFarren

[57] ABSTRACT

A virtual amplifier comprises a typical switched source follower circuit plus an additional switch of minimum size to perform a virtual amplification function. A capacitor is connected between the gate, which comprises a detector node, and the source, which comprises a source node, of a source follower FET. The source node is connected to the output by a first FET switch. The source node is also connected to a voltage source by a second FET switch. The voltage on the detector node is manipulated by pumping a charge into or out of the capacitor. Charge pumping is accomplished by first accumulating charge on the detector node while the source node is connected to the voltage source, and then switching the first FET switch on and the second FET switch off so that the effective capacitance of the detector node is reduced. Thus, the low voltage that is generated during charge accumulation, and which is desirable for maintaining a constant detector bias, is greatly increased for readout by capacitive charge pumping without power dissipation or noise penalty.

10 Claims, 1 Drawing Sheet

VIRTUAL AMPLIFIER

The United States Government has rights in this invention under contract number F29601-88-C-0075 awarded by the Department of the Air Force.

TECHNICAL FIELD

The present invention relates to parametric amplification circuits used in analog communications systems and, in particular, to a compact virtual amplifier that utilizes a charge pumping mechanism to provide high speed, low noise amplification with low power dissipation.

BACKGROUND OF THE INVENTION

In many state of the art integrated circuits, emphasis is placed on providing signal amplification with low noise and low power dissipation. There are always demands for circuit improvements that enable higher functional throughput, increased on-chip signal processing, higher data rates, lower noise, less power dissipation, smaller cell size, and greater radiation hardness. In general, improved unit cell designs are needed to maximize functionality and provide high gain while minimizing noise, power dissipation, and cell size. Unfortunately, increased unit cell functionality usually requires greater circuit complexity, which leads to more noise and increased power dissipation. These conflicting requirements stretch the capabilities of many of the present electronic circuit designs.

In the electronic circuitry of focal plane array (FPA) detectors, for example, the input cells that integrate the photocurrent generated in the detectors have two conflicting requirements. During the time when integration occurs, the input capacitance of the detector and input cell must be sufficiently large to minimize debiasing of the detector. During readout of the detector, however, the input capacitance should be very small to maximize the output voltage that is a measure of the integrated current. Prior circuit designs have attempted to compromise these conflicting requirements, with the result of allowing some nonlinearities from detector debiasing while accepting low output voltage with a usable signal-to-noise ratio.

Specifications for advanced FPAs require sensing of very low signal levels. For a detector system to maintain good sensitivity and resolution, the readout device of the FPA must amplify input signals received at the noise equivalent input (NEI) photon level so that the output signals are above the noise floor of the multiplexer and data processing electronics that follow the FPA. In some FPA applications, the sensor is required to perform in a low flux background while covering a wide dynamic range. The input cell design for the readout device in such a sensor is limited to either a capacitive transimpedance amplifier (CTIA) or a direct integration approach. A standard switched FET multiplexer design (source follower per cell), for example, ignores the need for amplification, with the result that the output voltage tracts the input node voltage with near unity gain. The advantage of this design is circuit simplicity and threshold voltage variation tolerance.

In state-of-the-art sensors, a detector bias change limitation is required for either 1/f noise suppression (in mercury cadmium telluride detectors) or response linearity maintenance (in impurity band conduction (IBC) detectors). For IBC detectors, the input and output node voltage swings are limited to 0.4 volts or less to maintain good detector response linearity. As a result, an amplifier is usually added to the standard switched FET multiplexer described above. The added amplifier, however, significantly increases cell size and complexity as well as power dissipation. The amplifier also tends to behave as an additional noise source. Thus, the amplifier, which is added to improve the noise performance of the multiplexer, is somewhat self-defeating in that it contributes to the noise of the circuit.

FIG. 1 illustrates a prior art FPA output device comprising a conventional amplifier 11 added to a standard switched FET multiplexer 12 as described above. Amplifier 11 contains FETs 13, 14, and 15 and capacitor 16 configured to amplify the signal on input node 18 to an acceptable value on output node 19. This design solves the detector debiasing problem, but it requires a relatively large amount of space in an integrated circuit and it consumes power in proportion to the speed at which it operates. Because of these deficiencies, there is a need for an improved readout circuit that provides higher functional throughput, increased on-chip signal processing, higher data rates, more pixels per array, lower noise, less power dissipation, smaller cell size, and greater radiation hardness.

SUMMARY OF THE INVENTION

The present invention is a virtual amplifier that incorporates the principle of parametric amplification without the use of non-linear analog components. The virtual amplifier comprises a conventional source follower circuit with an additional switch of minimum size to perform the virtual amplification function. To provide virtual amplification by charge pumping, a capacitor is connected between the gate, which comprises the detector node, and the source, which comprises the source node, of a source follower FET. The source node is connected to the circuit output by a first FET switch, as is typical in the art. However, in the present invention the source node is also connected to a voltage source by a second FET switch. The voltage on the detector node is manipulated by pumping a charge into or out of the capacitor. Charge pumping is accomplished by first accumulating charge at the detector node while the source node is connected to the voltage source, and then switching the first FET switch on and the second FET switch off so that the effective capacitance of the detector node is reduced by bootstrapping action. As a result, the low voltage that is generated during charge accumulation, and which is desirable for maintaining a constant detector bias, is greatly increased for readout by capacitive charge pumping without power dissipation or noise penalty.

BRIEF DESCRIPTION OF THE DRAWINGS

For a more complete understanding of the present invention and for further advantages thereof, the following Detailed Description of the Preferred Embodiment makes reference to the accompanying Drawings, in which.

DETAILED DESCRIPTION OF THE PREFERRED EMBODIMENT

Figure 2:
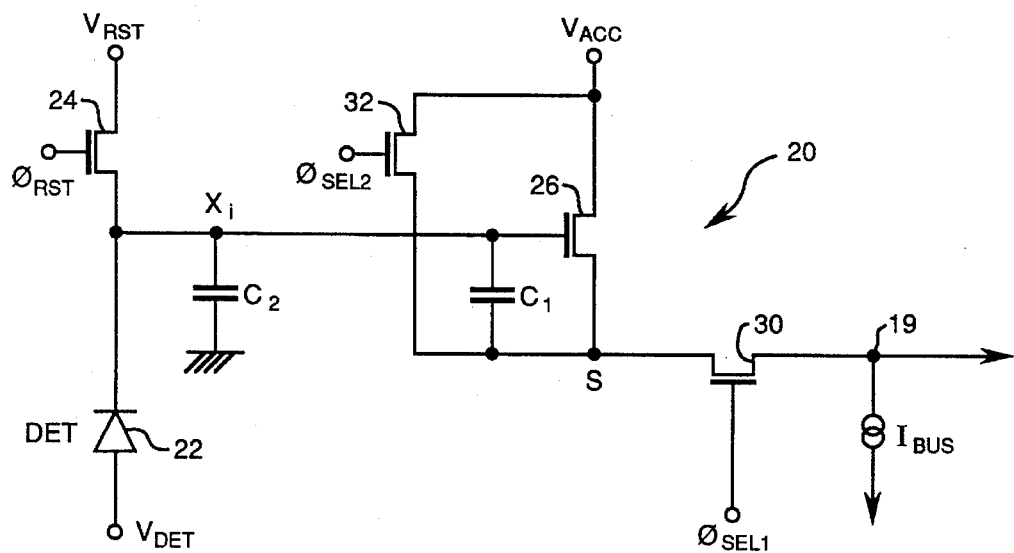
FIG. 2 is a schematic diagram of a virtual amplifier of the present invention having a capacitor connected for charge pumping.

A virtual amplifier 20 of the present invention is illustrated in the schematic diagram of FIG. 2. Virtual amplifier 20 comprises a readout circuit for signals output by an infrared detector, represented by a diode 22, to a reference or detector node $X_i$. Virtual amplifier 20 was designed as a readout cell for infrared focal plane array (FPA) detectors, but the circuit design is applicable to any large scale integrated circuit where amplification of a signal on a reference node must be performed with a cell of small size that produces low noise and low power dissipation.

Figure 1:
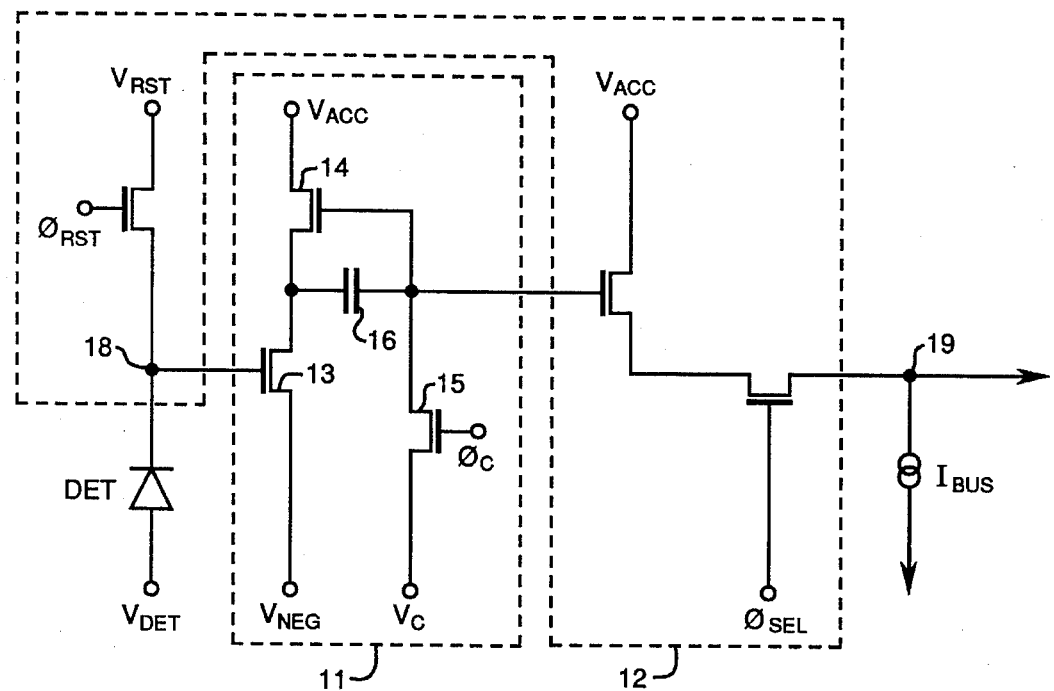
FIG. 1 is a schematic diagram of a prior art readout device having a conventional amplification circuit added to a switched FET multiplexer.

Virtual amplifier 20 includes a reset FET 24; a source follower FET 26 having a gate connected to detector node $X_i$, a drain connected to a voltage source $V_{ACC}$, and a source connected to a source node S; and a readout FET switch 30, all of which are well known in the art. However, virtual amplifier 20 includes a second FET switch 32 connected between voltage source $V_{ACC}$ and source node S of FET 26. As would be obvious to one skilled in the art, FET switch 32 is connected to voltage source $V_{ACC}$ for convenience and circuit simplicity but could be connected, in the alternative, to a second voltage source (not shown) separate from voltage source $V_{ACC}$. When compared with the prior art circuit of FIG. 1, it can be seen that FET switch 32 replaces essentially all the components of amplifier 11. Virtual amplifier 20 also includes a capacitor $C_1$ connected between detector node $X_i$ and source node S. Capacitor $C_1$ includes any stray capacitance between the gate and source of FET 26 as well as the intentionally added capacitance between nodes $X_i$ and S. Additional capacitor $C_2$ represents the sum of all the stray capacitances on node $X_i$ other than capacitor $C_1$. FET 32 functions to switch capacitor $C_1$ in and out of the circuit in a charge pumping manner during an integration period and a readout period, respectively. To maximize amplification, stray capacitances other than $C_1$ should be minimized. Amplification is proportional to the ratio of detector node capacitances during the integration and readout periods, respectively. As a result of charge pumping, amplification is implemented in a digital manner, thereby eliminating the need for an additional analog amplifier in each unit cell of the readout device.

When a capacitor is switched out of a circuit in the usual manner, it carries the stored charge with it and there is no net change in the node voltage. With charge pumping, however, the accumulated charge at detector node $X_i$ is conserved by pumping the charge from capacitor $C_1$ that is being switched out of the circuit into the remaining capacitance $C_2$ sharing detector node $X_i$. Charge pumping is achieved by keeping capacitor $C_1$ connected to detector node $X_i$ while node S of the capacitor is switched between two well-defined circuit nodes. Because of the charge-to-voltage conversion equation, V=Q/C, voltage on detector node $X_i$ increases when the total capacitance is reduced.

During the integration period of virtual amplifier 20, source node S is connected to the bias of voltage source $V_{ACC}$ by turning FET switch 32 on and FET switch 30 off. In this mode, charge can accumulate in the capacitances connected to detector node $X_i$. During the readout period, FET switch 32 is turned off and FET switch 30 is turned on so that node S becomes the active source of source follower FET 26. During the integration period when node S is held at a fixed voltage, capacitor $C_1$ is the major contributor to the total capacitance, $C_T=C_1+C_2$, on detector node $X_i$. Detector voltage change at node $X_i$ due to a given signal charge is inversely proportional to the value of the capacitance at node $X_i$. Therefore, the voltage swings at detector node $X_i$ can be kept small by incorporating a relatively large value of capacitor $C_1$. This has the benefit of maintaining good linearity for the detector response.

FIG. 2 illustrates the ideal circuit for virtual amplifier 20. The ideal circuit comprises a source follower having unity gain with a gate-to-source voltage equal to $V_{th}$, the threshold voltage of source follower FET 26. During a reset operation prior to the integration period, the voltage at detector node $X_i$ is set to $V_{i1}=V_{th}+V_{s1}$, where $V_{s1}$ is the voltage at node S supplied by voltage source $V_{ACC}$ while FET switch 32 is on. During the integration period of virtual amplifier 20 when FET switch 32 is on and FET switch 30 is off, the capacitance of detector node $X_i$ is $C_T=C_1+C_2$. If a charge of —Q accumulates on the capacitance during the integration period, detector node $X_i$ has a voltage of $V_{i2}=V_{th}+V_{s1}-Q/C_T$. During the readout period of virtual amplifier 20, FET switch 32 is turned off and FET switch 30 is turned on. When node S is disconnected from voltage source $V_{ACC}$, the voltage at node S will first drop to $V_{s2}=V_{s1}-Q/C_T$ because it must have a value one threshold voltage less than the gate voltage (i.e., $V_{i2}$) of source follower FET 26. However, since the voltage at node S of $C_1$ is reduced from $V_{s1}$ to $V_{s2}$, the accumulated charge —Q can no longer maintain the voltage $V_{i2}$ at detector node $X_i$. Therefore, the voltage at detector node $X_i$ is reduced further. The voltages on nodes S and $X_i$ are both driven down as a result of the circuit attempting to satisfy the threshold voltage drop between the gate and source of source follower FET 26 while attempting to support the charge —Q on node $X_i$ of capacitor $C_1$. This process continues until the charge —Q is distributed only over the capacitance $C_2$. The voltage at detector node $X_i$ becomes $V_{i3}=V_{th}+V_{s1}-Q/C_2$ and the voltage at node S becomes $V_{s3}=V_{s1}-Q/C_2$. In summary, when node S of capacitor $C_1$ is connected to the active source of source follower FET 26 it can no longer accumulate charge on the gate node $X_i$ of FET 26. Thus, for the ideal case, the effective capacitance of detector node $X_i$ is reduced to $C_2$ during the readout period.

In an actual circuit, the source follower gain will be x % of unity, such as 95% for example. In this case, the capacitance of detector node $X_i$ during the readout period becomes $C_R=C_2+C_1$ (1-x %), which is still a large reduction in capacitance over that during the integration period. The voltage increase at detector node $X_i$ during the readout period can be maximized by minimizing the parasitic capacitances at detector node $X_i$ and maximizing the source follower gain. The current state-of-the-art can achieve detector node $X_i$ capacitance (i.e., $C_2$) as low as 130 fF (i.e., $1.3 \times 10^{-13}$ farad). With a detector signal of $8 \times 10^5$ maximum signal electrons, for example, 130 fF provides a 1 volt voltage swing during readout, which is acceptable for many applications of virtual amplifier 20.

Virtual amplifier 20 provides the following advantages compared with prior readout circuits: 1) it minimizes cell size; 2) it does not consume bias power as does a conventional amplifier; 3) it minimizes kTC noise because reset occurs during the low capacitance period; 4) it does not use analog mode FETs that add noise to the readout device; and 5) it favors radiation hardness because it provides the same good threshold shift tolerance as a standard switched FET design.

Although the present invention has been described with respect to a specific embodiment thereof, various changes and modifications may be suggested to one skilled in the art. For example, the concept of using two different voltage scaling values can be extended to other amplification requirements and applied to current and voltage as well as charge inputs, thus providing a wide range of applications in VLSI circuit design. Therefore, it is intended that the present invention encompass such changes and modifications as fall within the scope of the appended claims.

I claim:

1. A virtual amplifier, comprising:

a source follower FET having a gate connected to a reference node, a drain connected to a first voltage source, and a source connected to a source node;

means for connecting said source node to a second voltage source during a first period;

means connected between said reference node and said source node for accumulating a charge input on said reference node during said first period;

means for connecting said source node to an output node during a second period; and means for switching connection of said source node from said second voltage source during said first period to said output node during said second period.

2. The virtual amplifier of claim 1, wherein said means for connecting and switching comprise:

a first FET switch connected between said source node and said output node; and a second FET switch connected between said source node and said second voltage source, wherein said first and second voltage sources are equivalent.

3. The virtual amplifier of claim 2, wherein said means for accumulating a charge comprises a capacitor connected between said reference node and said source node.

4. The virtual amplifier of claim 3, wherein said reference node comprises a detector node for receiving a low current signal input to the virtual amplifier by an infrared detector.

5. A virtual amplification circuit, comprising:

a reference node for receiving an input signal to be amplified;

a source follower transistor having a gate connected to said reference node, a drain connected to a voltage source, and a source connected to a source node;

a first FET switch connected between said source node and an output node;

a capacitor connected between said reference node and said source node;

a second FET switch connected between said voltage source and said source node; and said first and second FET switches comprising means for switching connection of said source node from said voltage source during a first period to said output node during a second period.

6. The virtual amplifier of claim 5, wherein said reference node comprises a detector node for receiving a low current signal input to the virtual amplifier by an infrared detector.

7. The virtual amplifier of claim 6, wherein the amplifier comprises a unit cell for reading an output of one detector of a focal plane array.

8. A method of virtual amplification of a signal, comprising the steps of:

providing a source follower FET having a gate, a drain, and a source;

connecting said gate to a reference node, said drain to a voltage source, and said source to a source node;

connecting said source node to said voltage source during a first period;

connecting a capacitance between said reference node and said source node;

providing a low current signal on said reference node during said first period for accumulating a charge on said capacitance, said accumulated charge producing a low voltage on said reference node; and switching connection of said source node from said voltage source to an output node during a second period, thereby reducing said capacitance and increasing said voltage on said reference node during said second period.

9. The method of claim 8, wherein the steps of connecting and switching further comprise the steps of:

connecting a first FET switch between said source node and said output node;

connecting a second FET switch between said source node and said voltage source;

switching said first FET switch off and said second FET switch on during said first period; and switching said first FET switch on and said second FET switch off during said second period.

10. The method of claim 9, wherein the step of providing a low current signal comprises connecting an output of an infrared detector to said reference node.

* * * * *